(12) United States Patent
Polnyi

(10) Patent No.: US 8,052,454 B2
(45) Date of Patent: Nov. 8, 2011

(54) ELECTRICAL CONNECTOR WITH IMPROVED FEATURE FOR SECURING SOLDER BALL THEREON

(75) Inventor: Igor Polnyi, Aurora, IL (US)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/650,567

(22) Filed: Dec. 31, 2009

(65) Prior Publication Data

US 2011/0159709 A1 Jun. 30, 2011

(51) Int. Cl.
*H01R 4/50* (2006.01)
(52) U.S. Cl. .......................................... 439/342; 439/66
(58) Field of Classification Search .................... 439/66, 439/70–72, 74, 83, 342, 856, 857, 862, 733.1
See application file for complete search history.

(56) References Cited

U.S. PATENT DOCUMENTS

| | | | |
|---|---|---|---|
| 6,482,050 B1 * | 11/2002 | Lemke et al. | 439/856 |
| 6,638,119 B1 * | 10/2003 | Chang | 439/857 |
| 7,147,489 B1 | 12/2006 | Lin | |
| 7,303,421 B2 * | 12/2007 | Liao | 439/342 |
| 7,427,203 B2 * | 9/2008 | Liao | 439/66 |
| 7,467,949 B2 * | 12/2008 | Liao | 439/66 |
| 7,479,015 B2 * | 1/2009 | Ruttan et al. | 439/66 |
| 7,828,578 B1 * | 11/2010 | Ju | 439/342 |
| 2002/0115324 A1 | 8/2002 | Wilson et al. | |
| 2003/0203660 A1 | 10/2003 | Kassa et al. | |
| 2006/0094268 A1 | 5/2006 | Hao | |

FOREIGN PATENT DOCUMENTS

| | | | |
|---|---|---|---|
| CN | 2610515 Y | 4/2004 | |
| CN | 2872630 Y | 2/2007 | |

\* cited by examiner

*Primary Examiner* — Thanh Tam Le
(74) *Attorney, Agent, or Firm* — Andrew C. Cheng; Wei Te Chung; Ming Chieh Chang

(57) ABSTRACT

An electrical connector includes an insulative housing with a number of passageways, a number of electrical contacts received in the passageways and a number of solder balls disposed on the electrical contacts respectively. The electrical contact or together with the insulative housing form a retention feature for pre-setting the solder balls thereon.

15 Claims, 14 Drawing Sheets

ELECTRICAL CONNECTOR WITH IMPROVED FEATURE FOR SECURING SOLDER BALL THEREON

BACKGROUND OF THE INVENTION

1. Field of the Invention

The present invention generally relates to an electrical connector and, more particularly, to an electrical connector with solder balls secured to the contacts thereof.

2. Description of Related Art

Central processing unit (CPU) sockets are used to transmit signals between a CPU and a printed circuit board in computer device. Generally, the CPU socket comprises an insulative housing and a plurality of conductive terminals. Each of the conductive terminals electrically connects with the printed circuit board through surface mounting technology (SMT) by pre-setting solder balls on one end thereof.

Chinese patent issue No. 2610515Y issued to Lotes on Apr. 7, 2004 discloses one type of electrical connector which includes an insulative housing 12 and a number of electrical contacts 14. The insulative housing 12 defines a number of straight passageways 120 for receiving the electrical contacts 14 therein and a projection 122 is disposed in a lower end of the passageways 120. The electrical contact 14 is configured to a U shaped configuration and has a pair of shoulders at a lower end thereof for receiving a solder ball. The electrical contacts are used to pre-set the solder balls before surface mounting to the PCB.

Chinese patent issue No. 2872630Y issued to Lotes on Feb. 21, 2007 discloses another type of electrical connector for pre-setting solder balls. The electrical connector includes an insulative housing 1 with passageways 10 therein and a plurality of electrical contacts 2 received in the passageways 10. The insulative housing 1 defines a number of solder ball receiving portions 12. Bottom end 21 of the contact 2 and side wall 14 of the solder receiving portion 12 jointly define a receiving space 16 for the solder ball 3 moveably received therein. The solder balls are hold by the side wall 14 and the bottom end 21 of the contact 2 whereby to be pre-set on the electrical connector.

The above electrical connectors are two schemes to locate the solder balls thereon before surface mounting to the PCB. The present invention provides a different method to locate and connect the solder ball.

BRIEF SUMMARY OF THE INVENTION

An object of the present invention is to provide an electrical connector with improved retention feature for pre-setting solder balls on the electrical contacts thereof.

An electrical connector comprises an insulative housing with a plurality of passageways extending therethrough and a plurality of electrical contacts retained in the passageways. Each electrical contact comprises a plate portion interfering with the insulative housing, a pair of upper arms extending upwardly from the plate portion and a pair of lower arms extending downwardly from the plate portion. The upper and lower arms are twisted so as to have free ends thereof run out of a vertical plane defined by the plate portion.

According to one of the embodiments, an electrical connector comprises an insulative housing defining a plurality of passageways extending therethrough and having a top surface and a bottom surface opposite to each other. A plurality of electrical contacts are retained in the passageways and each comprises a plate portion interfering with the insulative housing, a contact portion extending upwardly from the plate portion and a solder portion extending downwardly from the plate portion. The insulative housing comprises a plurality of retention features projecting from the bottom surface thereof which define a receiving space together with the solder tail of the contact for receiving a solder ball therein and form four supporting points contacting with the solder balls.

Still yet according to one of the embodiments, an electrical connector comprises an insulative housing defining a plurality of passageways extending therethrough and having a top surface and a bottom surface opposite to each other. A plurality of electrical contacts are retained in the passageways and each comprises a plate portion interfering with the insulative housing, a contact portion extending upwardly from the plate portion and a solder portion extending downwardly from the plate portion. The solder portion projects out of the bottom surface of the insulative housing and has an annular portion. The annular portion has a gap penetrating therethrough and has a supporting portion adjacent to the gap. The annular portion is expanded for securing a solder ball with the supporting portion limited by the insulative housing in a vertical direction.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
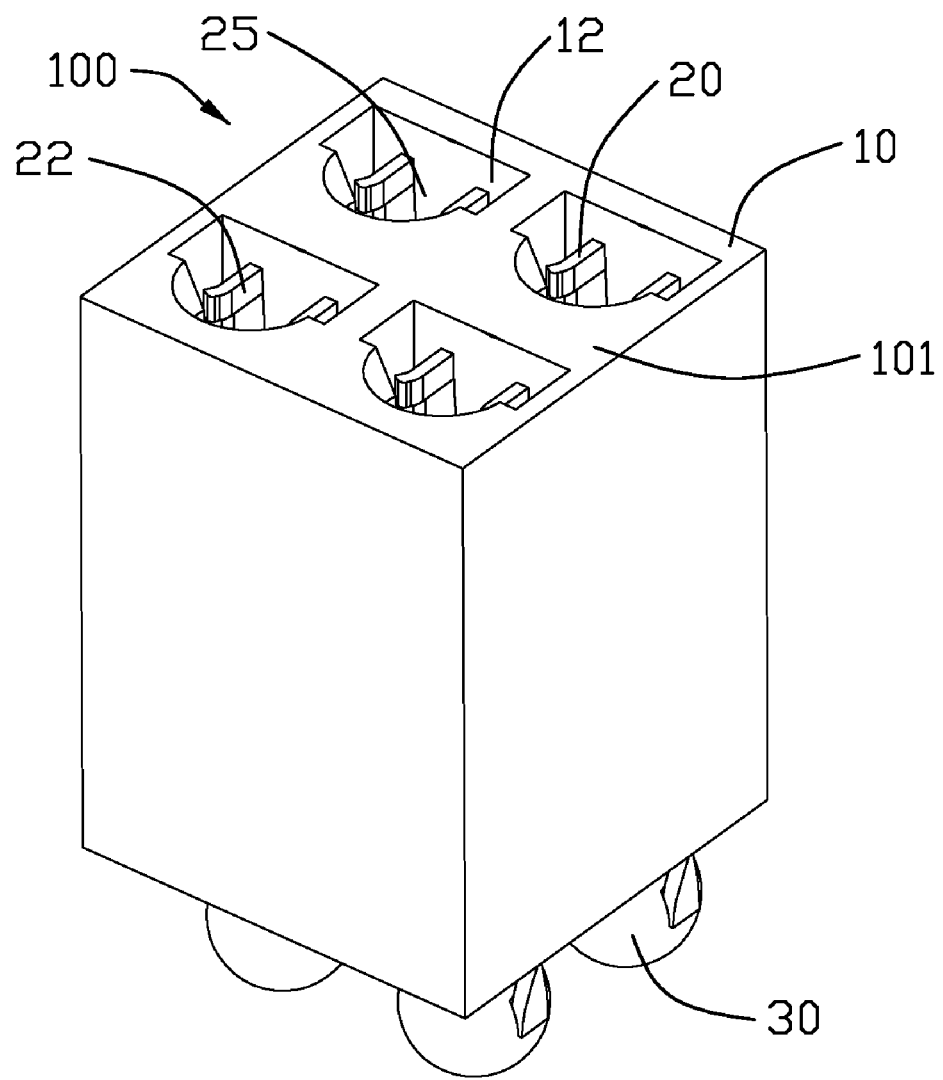
FIG. 1 is a perspective, assembly view of the electrical connector of a preferred embodiment according to the present invention.

Reference will be made to the drawing figures to describe the present invention in detail, wherein depicted elements are not necessarily shown to scale and wherein like of similar elements are designated by same or similar reference numeral through the several views and same or similar terminology.

Figure 2:
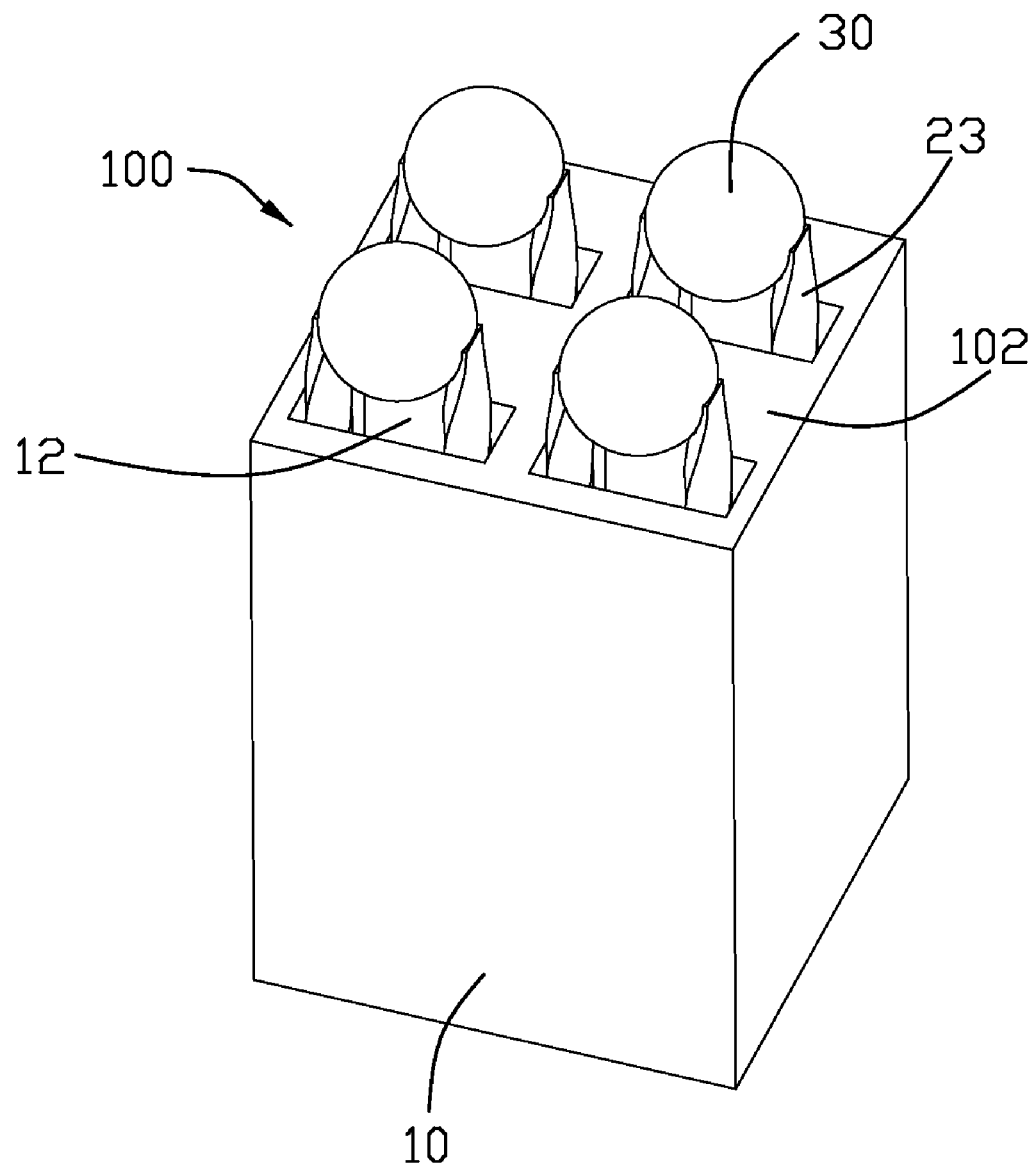
FIG. 2 is another perspective view of the electrical connector shown in FIG. 1.

Please referring FIGS. 1-2, an electrical connector 100 according to a prefer embodiment of the present invention comprises an insulative housing 10 with a plurality of passageways 12 extending therethrough and a plurality of electrical contacts 20 retained in the passageways 12. The insulative housing 10 has a top surface 101 and a bottom surface 102 opposite to each other.

Figure 3:
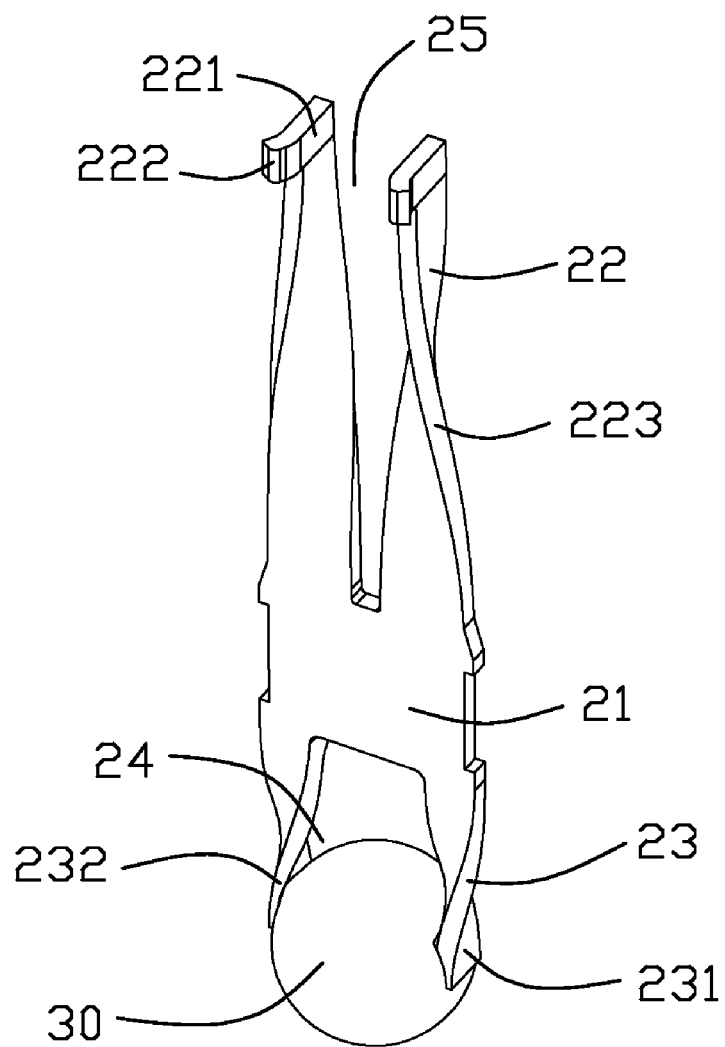
FIG. 3 is a perspective view of the electrical contact shown in FIG. 2 with a solder ball disposed thereon.
Figure 4:
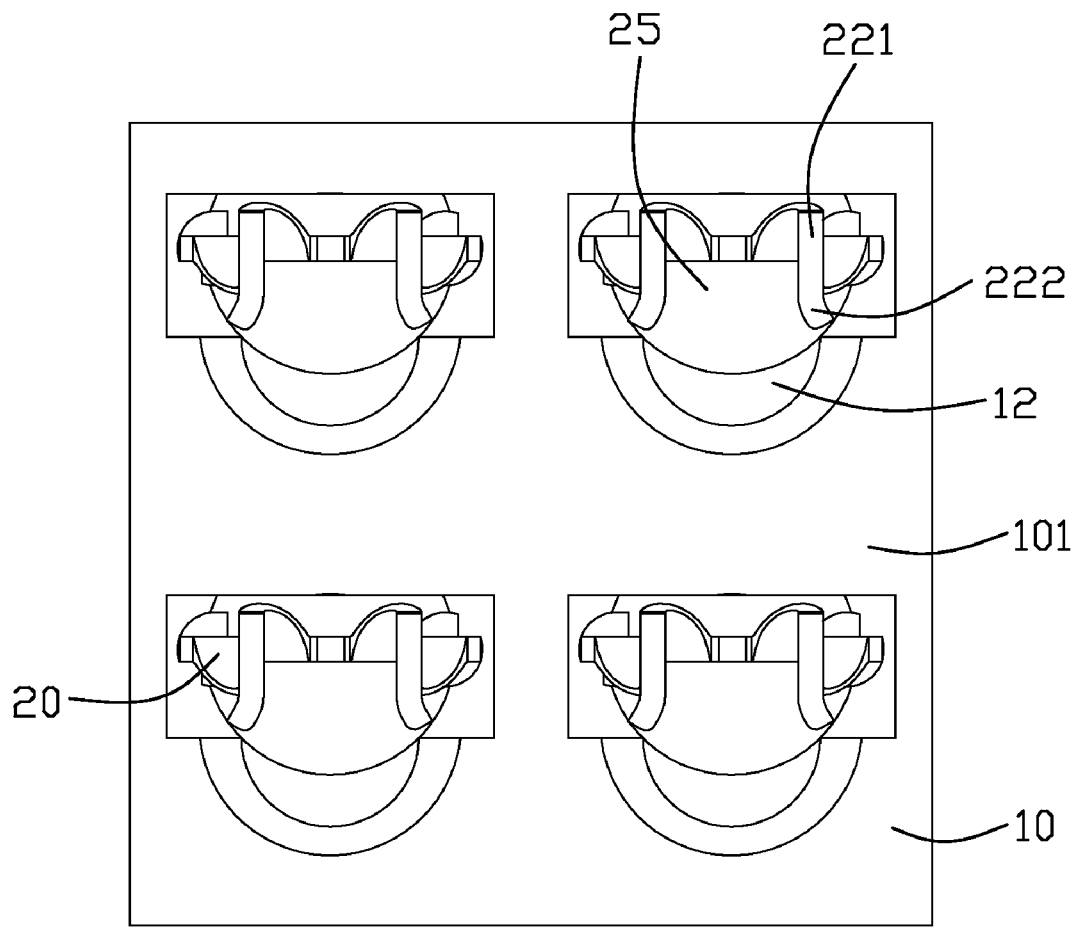
FIG. 4 is a top view of the electrical connector shown in FIG. 1.
Figure 5:
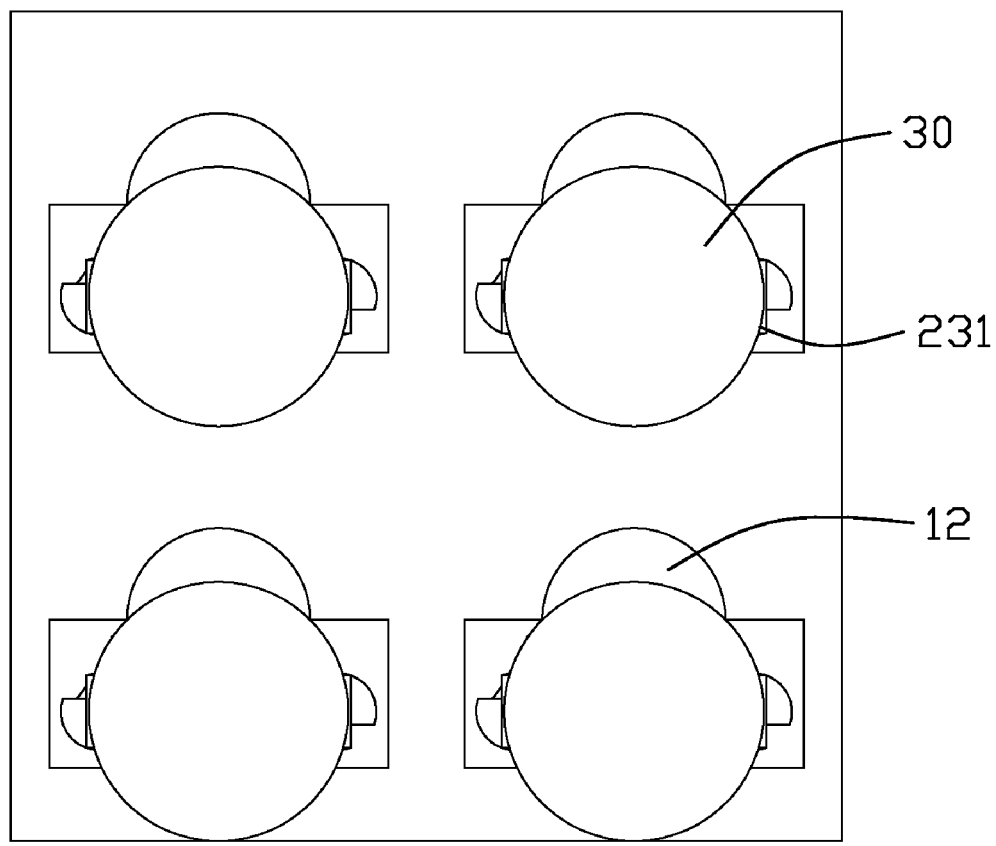
FIG. 5 is a bottom view of the electrical connector shown in FIG. 1.
Figure 6:
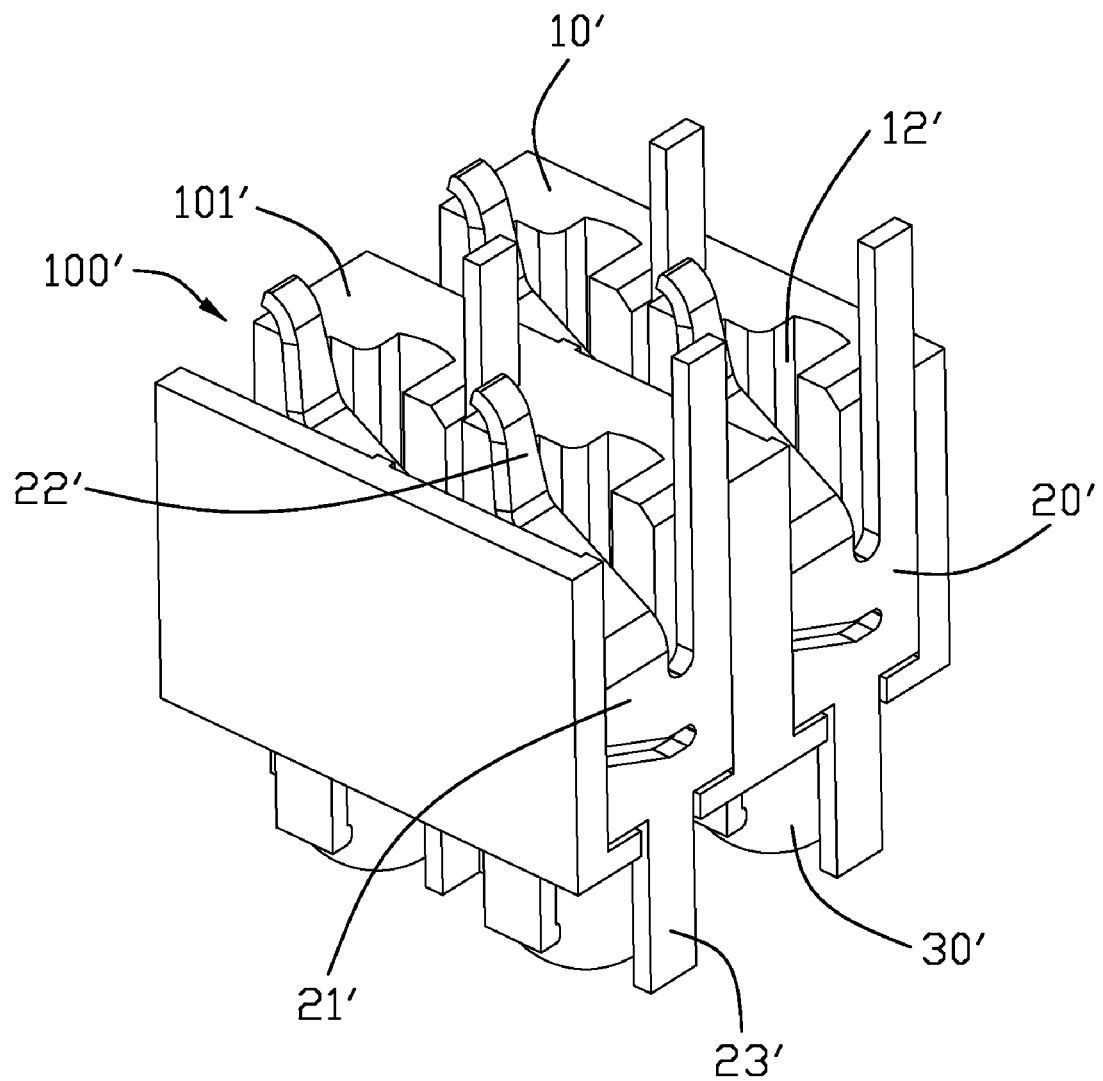
FIG. 6 is a perspective, assembly view of an electrical connector according to a second embodiment of the present invention.

Please also referring to FIGS. 3-5, each electrical contact 20 comprises a plate portion 21 interfering with the insulative housing 10, a pair of upper arms 22 extending upwardly from the plate portion 21 and a pair of lower arms 23 extending downwardly from the plate portion 21. The upper and lower arms 22, 23 are twisted so as to make free ends thereof run out of a vertical plane defined by the plate portion 21.

The upper arms 22 are twisted to opposite directions whereby forms a pair of twist portion 223 connecting with the plate portion 21 and a pair of contact portions 221 at the free ends thereof. The contact portions 221 are located at an upper end of the passageways 12 and define an upper space 25 therebetween. The pair of contacting portions 221 each has a guiding section 222 bent outwardly therefrom and defines an enlarged entrance (not labeled) which is communicated with the upper space 25. The contact portions 221 are perpendicular to the plate portion 21.

The pair of lower arms 23 is twisted to a same direction and define a lower space 24 therebetween. The lower arm 23 each has a twist portion 232 connecting with the plate portion 21. The free ends of the pair of lower arms 23 form a pair of solder portions 231 to clip a solder ball 30 therebetween. The solder portions 231 project out of the bottom surface 102 of the insulative housing 10. The solder portions 231 are perpendicular to the plate portion 21.

FIGS. 6-9 illustrates a second embodiment according to the present invention. An electrical connector 100' comprises an insulative housing 10' defining a plurality of passageways 12' extending therethrough and having a top surface 101' and a bottom surface 102' opposite to each other. A plurality of electrical contacts 20' are retained in the passageways 12' and each comprises a plate portion 21' interfering with the insulative housing 10', a contact portion 22' extending upwardly from the plate portion 21' and a solder portion 23' extending downwardly from the plate portion 21'.

Figure 7:
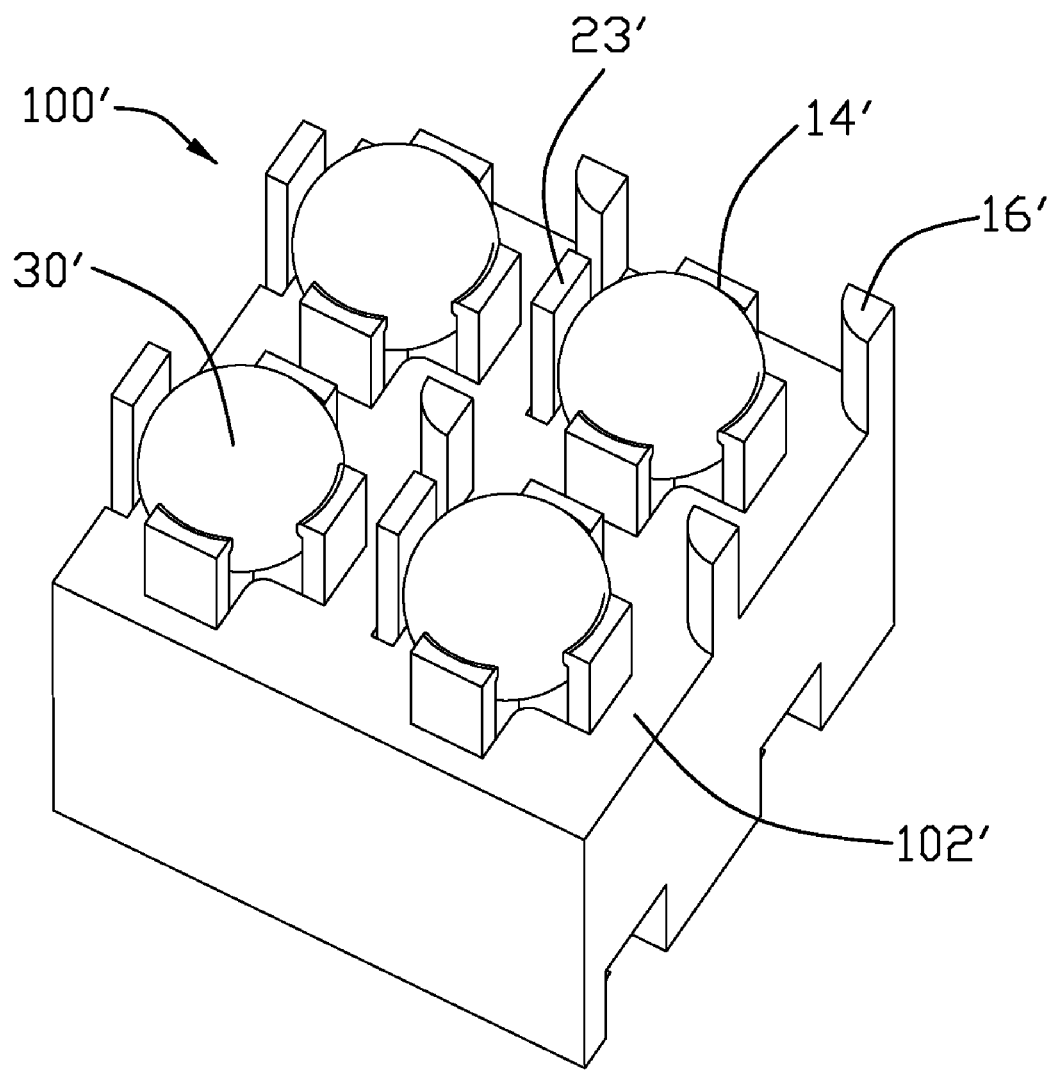
FIG. 7 is another perspective view of the electrical connector shown in FIG. 6.
Figure 8:
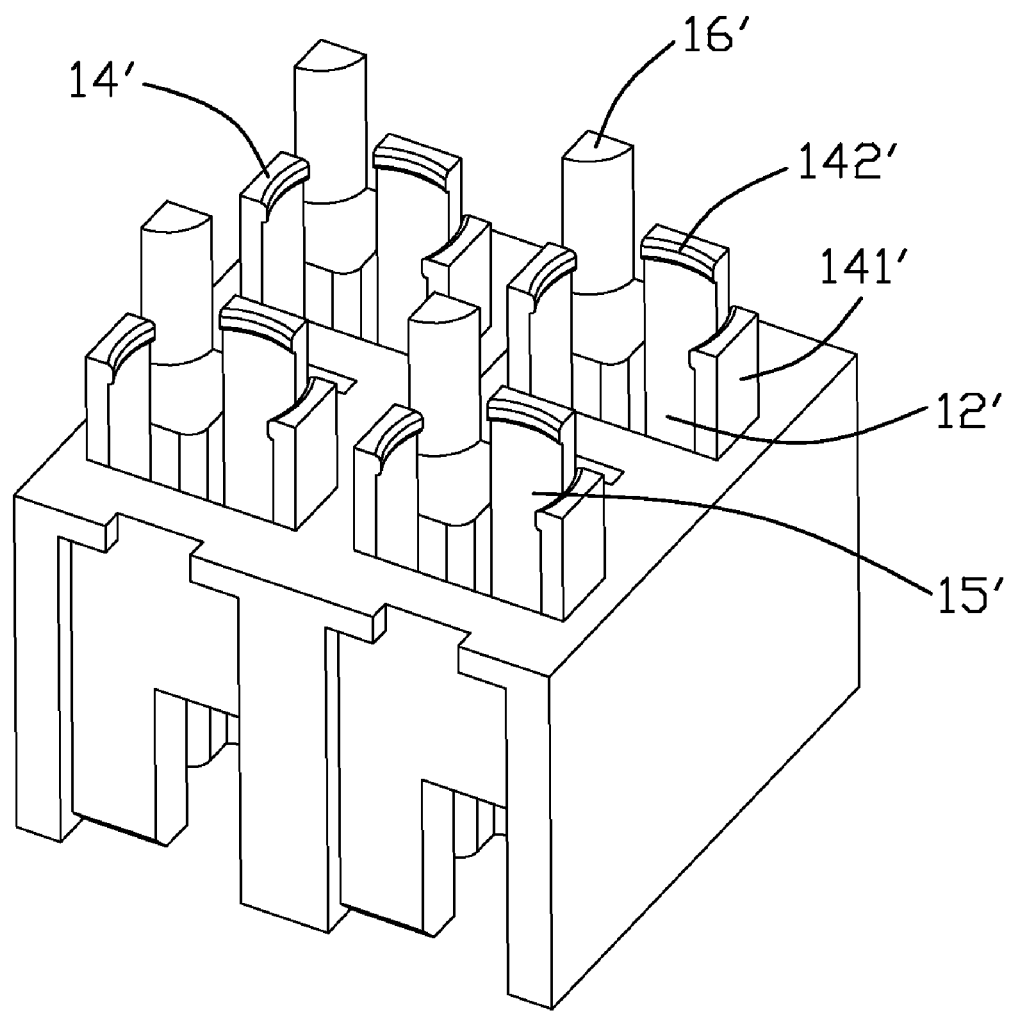
FIG. 8 is a perspective view of the insulative housing shown in FIG. 6.

Please refer to FIGS. 7 and 8, the insulative housing 10' comprises a plurality of retention features 14' projecting from the bottom surface 102' thereof. The retention feature 14' and the solder tail 23' of the contact 20' together define a receiving space 15' for receiving a solder ball 30' therein.

The retention feature 14' comprises three spring arms 141' integrally formed on the insulative housing 10' and located at three sides of the passageway 12'. The solder portion 23' of the electrical contact 20' is located at another side of the passageway 12'. Each spring arm 141' has a clip portion 142' extending inwardly to the receiving space 15' at free end thereof and the clip portion 142' has an arc contour corresponding to the solder ball 30'. The insulative housing 10' comprises a plurality of stand-offs 16 on the bottom surface 102' and the stand-offs 16' are extending downwardly beyond the retention features 14'.

Figure 9:
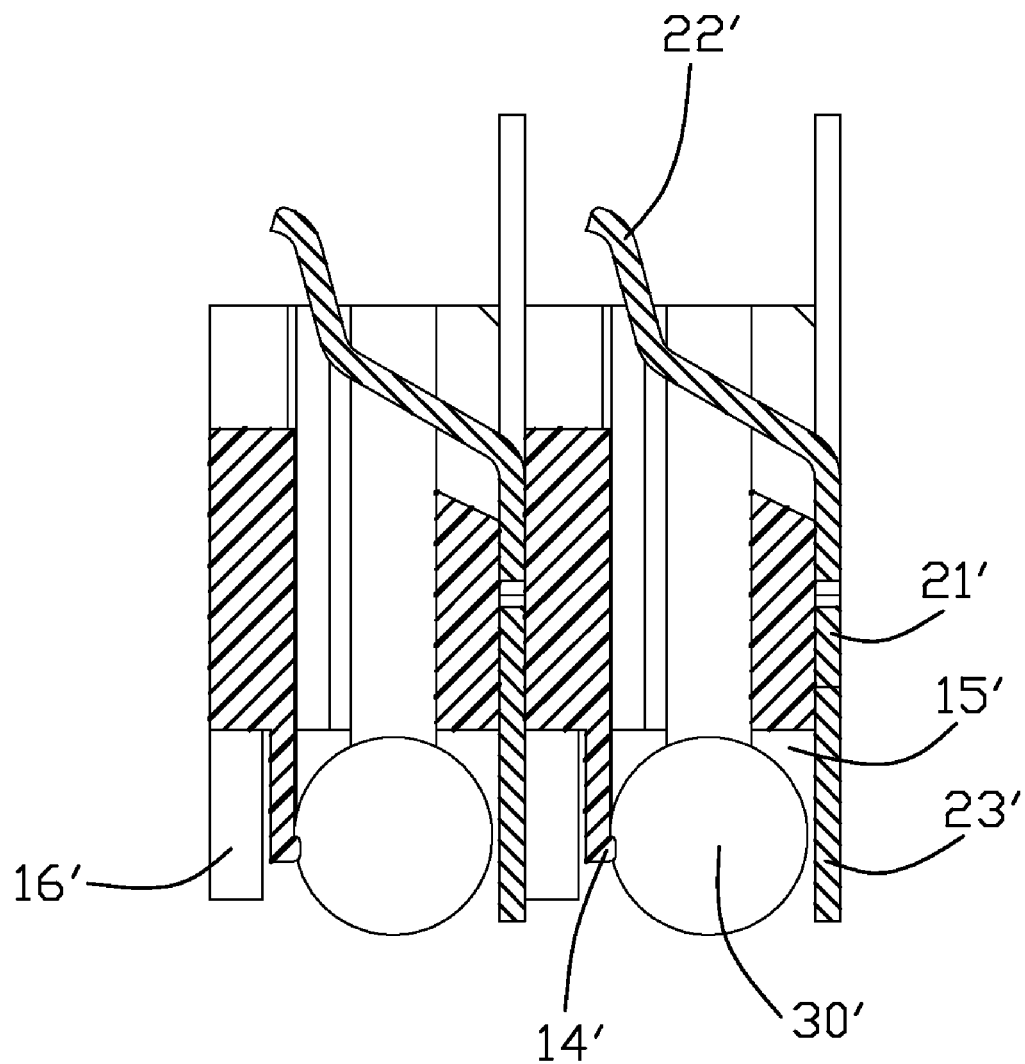
FIG. 9 is a cross-sectional view of the electrical connector shown in FIG. 6.

Please refer to FIGS. 7 and 9, the retention feature 14' and the electrical contacts 20' provide retention force for the solder ball 30'' at four sides thereof. After the solder ball 30' is located in the receiving space 15', there are four supporting points contacting with the solder ball 30'. One of the supporting points is formed on the solder portion 23' of the electrical contact 20' and the other three supporting points are formed on the retention feature 14'.

FIGS. 10-14 illustrates a third embodiment according to the present invention. An electrical connector 100'' comprises an insulative housing 10'' defining a plurality of passageways 12'' extending therethrough and having a top surface 101'' and a bottom surface 102'' opposite to each other; and a plurality of electrical contacts 20'' retained in the passageways 12''.

Figure 10:
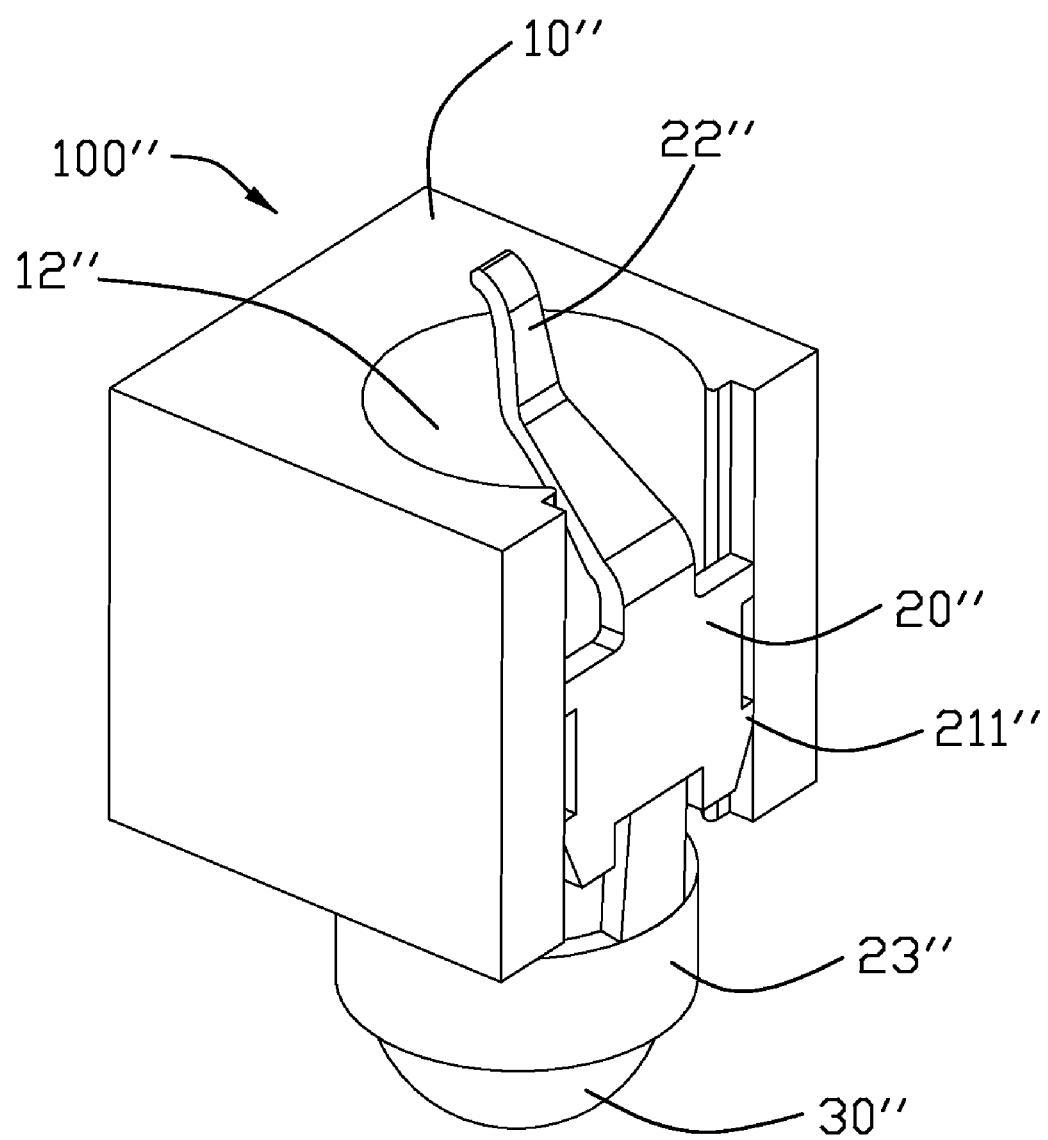
FIG. 10 is a perspective, assembly view of the electrical connector according to a third embodiment of the present invention.
Figure 11:
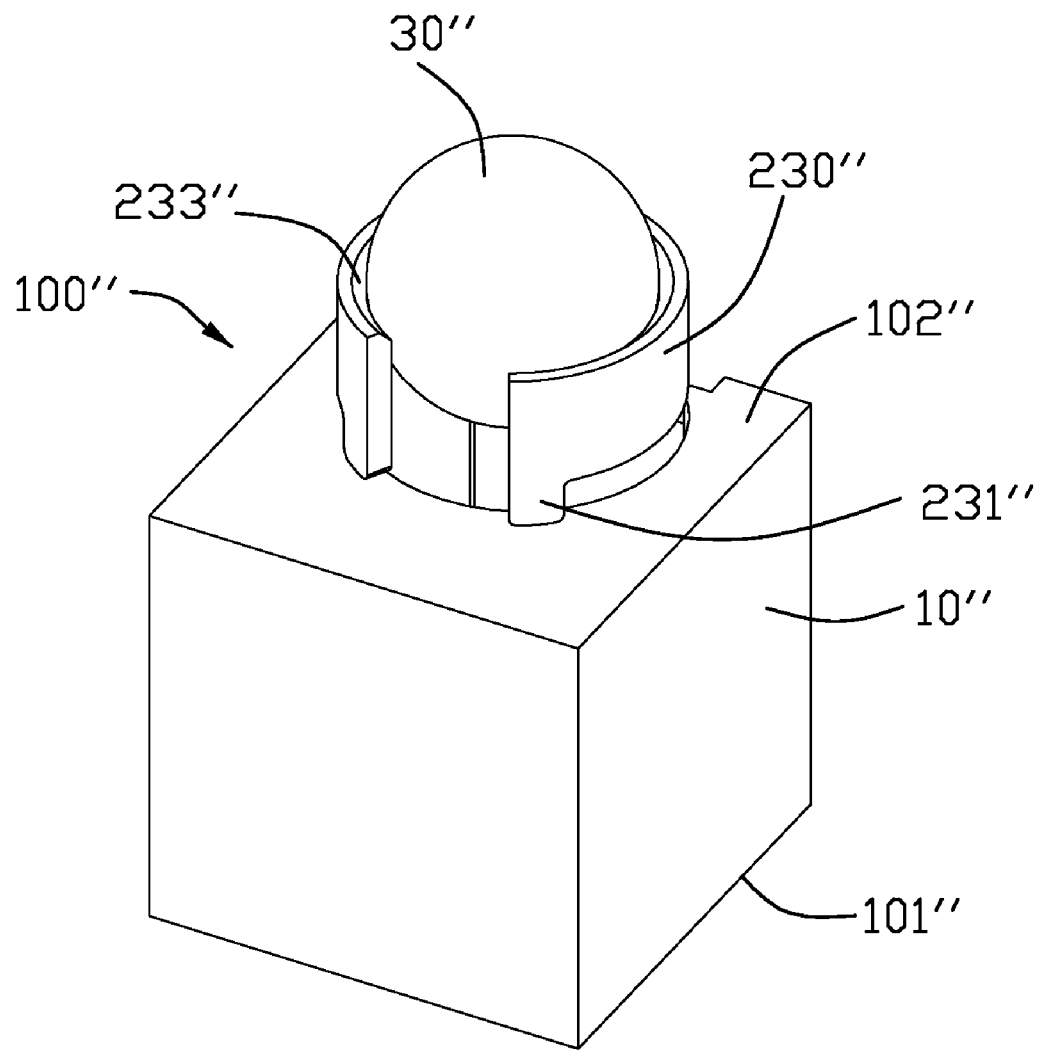
FIG. 11 is another perspective view of the electrical connector shown in FIG. 10.

Please refer to FIGS. 10 and 11, each electrical contact 20'' comprises a plate portion 21'' interfering with the insulative housing 10'', a contact portion 22'' extending upwardly from the plate portion 21'' and a solder portion 23'' extending downwardly from the plate portion 21''. The plate portion 21'' had a plurality of J-legs 211'' at opposite edges thereof for engaging with the insulative housing 10''. The solder portion 23'' projects out of the bottom surface 102'' of the insulative housing 10'' and has an annular portion 230'' with a gap 232'' penetrating therethrough and breaking the annular portion 230''. The solder portion 23'' further has a supporting portion 231'' adjacent to the gap 232''.

Figure 12:
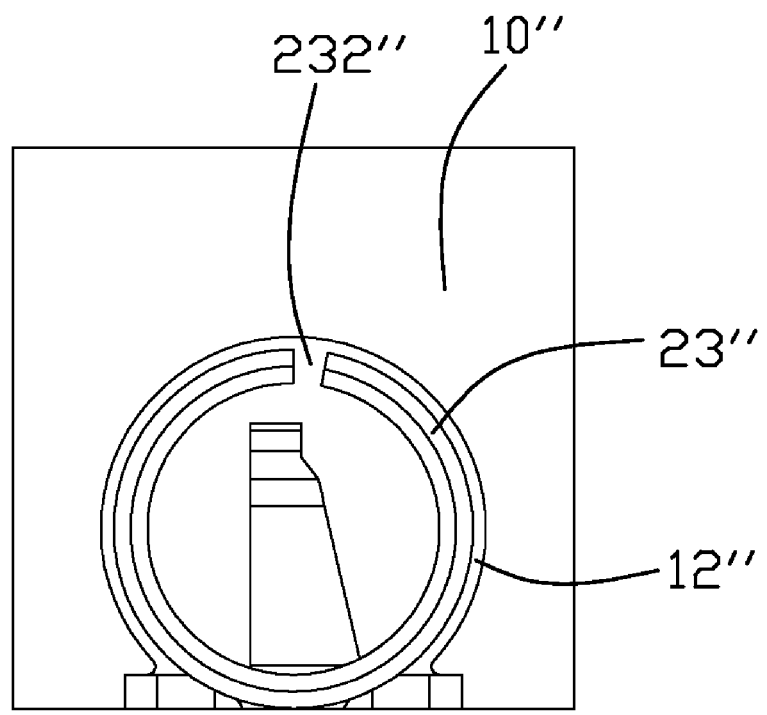
FIG. 12 is a bottom view of the electrical connector before the solder ball inserter therein.
Figure 13:
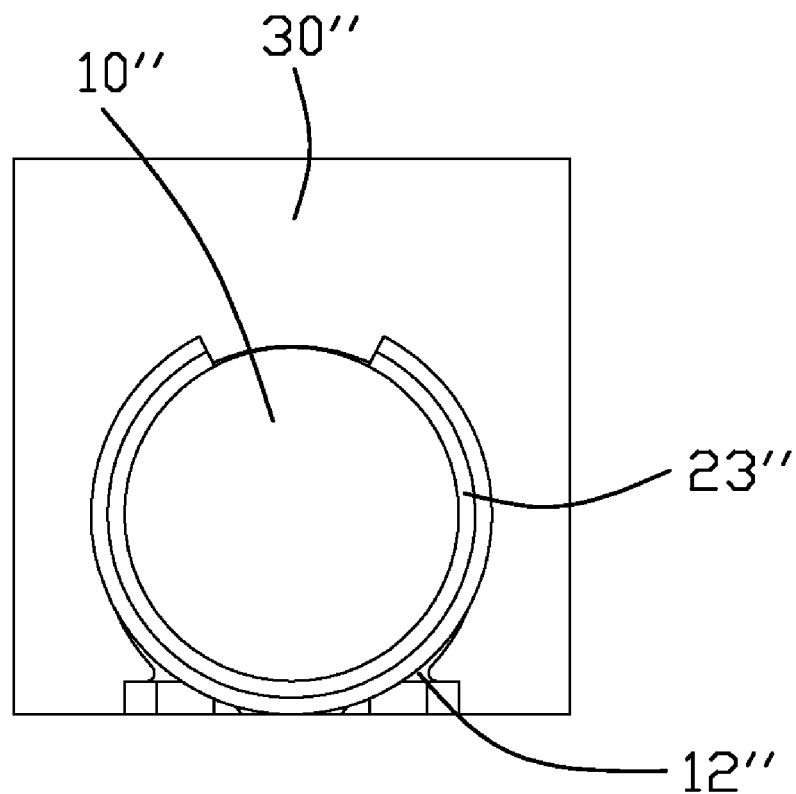
FIG. 13 is a bottom view of the electrical connector shown in FIG. 1.
Figure 14:
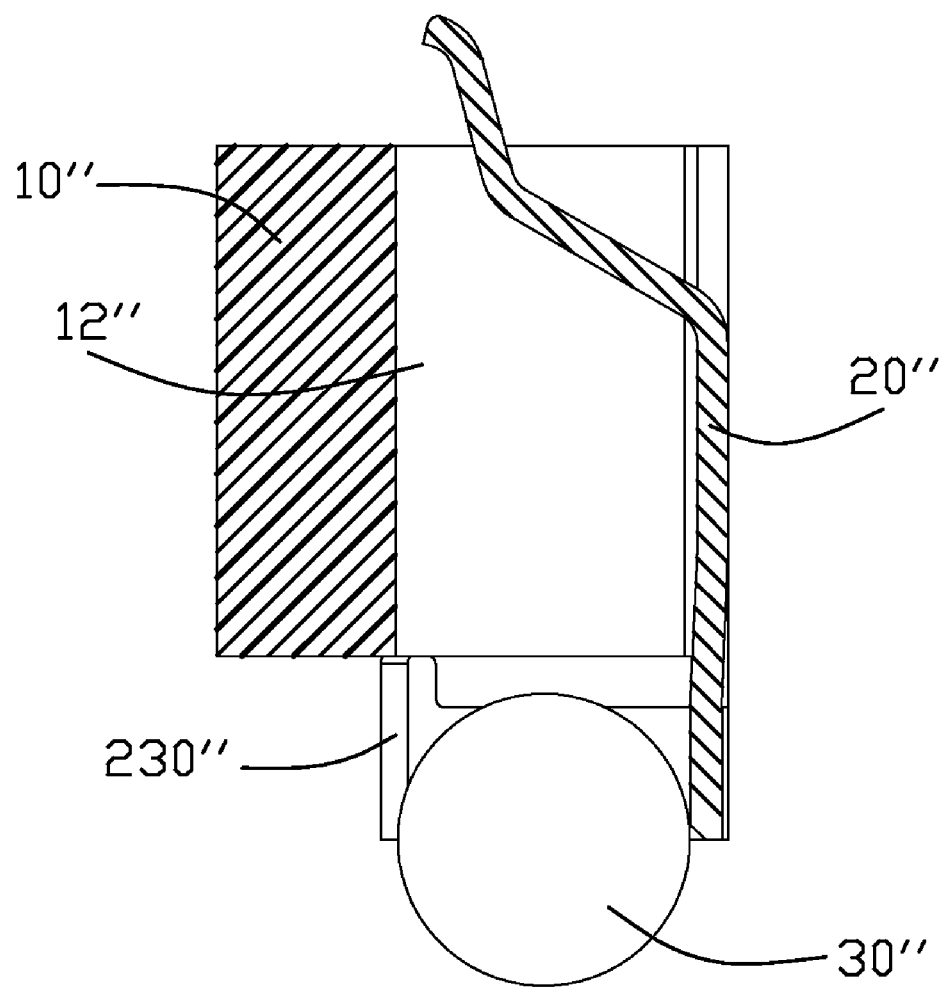
FIG. 14 is a cross-sectional view of the electrical connector shown in FIG. 10.

The supporting portion 231'' is located in the contour of the passageway 12'' before the solder ball 30'' inserted therein as shown in FIG. 12 and expands out of the contour of the passageway 12'' as shown in FIG. 13. The annular portion 230'' is round which also could be triangular, square or other polygon. The annular portion 230'' defines a lead-in chamfer 233'' at lower edge thereof for guiding a solder ball 30'' inserted into the annular portion 230''. The annular portion 230'' is smaller than the passageways 12'' of the insulative housing 10'' and turns to be larger than the passageway 12'' after the solder ball 30'' inserted therein. The annular portion 230'' is expanded to the biggest radius of the solder ball 30'' thereby securing the solder ball 30'' both in three directions. Furthermore, the supporting portion 231'' is limited by the insulative housing 10'' in a vertical direction thereby ensuring co-planarity of the solder balls 30'' as shown in FIG. 14.

The solder balls 30'' are retained in the vertical annular portion 230''. Since the diameter of the annular portion 230'' is smaller than the solder ball's 30'' diameter which can hold the solder ball 30'' in place. The smaller diameter of the annular portion 230'' also can reduce the thickness of the insulative housing 10'', which is specifically important for fine pitch applications. Moreover, when the annular portion 230'' are opened with the solder ball 30'' seated in, two supporting portions 231'' are engaging with the bottom surface 102'' in a vertical direction and prevent tilting or bending of the solder ball 30'' in the electrical contact 20''. The solder ball 30'' could be set to the required depth by co-planarity.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:
1. An electrical connector comprising:
an insulative housing with a plurality of passageways extending therethrough; and
a plurality of electrical contacts retained in the passageways and each comprising a plate portion interfering with the insulative housing, a pair of upper arms extend- ing upwardly from the plate portion and a pair of lower arms extending downwardly from the plate portion; wherein the upper and lower arms are twisted so as to make free ends thereof run out of a vertical plane defined by the plate portion; and wherein the pair of upper arms is twisted to opposite directions with respect to each other and the pair of lower arms is twisted to a same direction with respect to each other.

2. The electrical connector as claimed in claim 1, wherein the free ends of the pair of upper arms form a pair of contact portions which define an upper space therebetween.

3. The electrical connector as claimed in claim 2, wherein the free ends of the pair of lower arms forms a pair of solder portions which clip a solder ball therebetween.

4. The electrical connector as claimed in claim 3, wherein the pair of contact portions is perpendicular to the plate portion and the pair of solder portions is perpendicular to the plate portion.

5. The electrical connector as claimed in claim 2, wherein the pair of contacting portions each has a guiding section bent outwardly therefrom and defining an enlarged entrance which is communicated with the upper space.

6. The electrical connector as claimed in claim 2, wherein the contact portions are located at an upper end of the passageways and the solder portions are project out of a bottom surface of the insulative housing.

7. An electrical connector comprising:

an insulative housing with a plurality of passageways extending therethrough; and a plurality of electrical contacts retained in the passageways and each comprising a plate portion interfering with the insulative housing and defining a vertical plane, a mating portion extending upwardly from the plate portion and a pair of lower arms extending downwardly from the plate portion and twisted from said vertical plane; wherein each of the lower arms has an outer edge and an inner edge and the outer edge and inner edge of the each lower arm are located at opposite sides of the vertical plane.

8. The electrical connector as claimed in claim 7, wherein the lower arms each define a curved surface and a solder ball is disposed between the curved surfaces and clasped by the pair of lower arms.

9. The electrical connector as claimed in claim 8, wherein the pair of lower arms and the solder ball are located below a bottom surface of the insulative housing.

10. The electrical connector as claimed in claim 8, wherein the solder ball is secured by the pair of lower arms and not by the insulative housing.

11. The electrical connector as claimed in claim 7, wherein the lower arms form a pair of solder portions at a bottom end thereof and the pair of solder portions is perpendicular to the plate portion.

12. The electrical connector as claimed in claim 7, wherein the mating portion comprises a pair of upper arms twisted from said vertical plane.

13. The electrical connector as claimed in claim 12, wherein each of the upper arms has an outer edge and an inner edge and the outer edge and inner edge of the each upper arm are located at opposite sides of the vertical plane.

14. The electrical connector as claimed in claim 13, wherein the upper arms form a pair of contact portions at a top end thereof and the pair of contact portions is perpendicular to the plate portion.

15. An electrical connector comprising:

an insulative housing with a plurality of passageways extending therethrough; and a plurality of electrical contacts retained in the passageways and each comprising a plate portion interfering with the insulative housing, a pair of upper arms extending upwardly from the plate portion and a pair of lower arms extending downwardly from the plate portion; wherein each of the upper and lower arms are twisted along a corresponding extending axis so as to make free end portion thereof run out of a vertical plane defined by the plate portion and terminate at another vertical plane.

* * * * *